United States Patent
Kroon et al.

(10) Patent No.: US 9,436,014 B2
(45) Date of Patent: Sep. 6, 2016

(54) AUTOSTEREOSCOPIC DISPLAY APPARATUS HAVING OPTICAL MAGNIFICATION

(75) Inventors: Bart Kroon, Eindhoven (NL); Mark Thomas Johnson, Arendonk (BE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/125,407

(22) PCT Filed: Jun. 19, 2012

(86) PCT No.: PCT/IB2012/053072
§ 371 (c)(1),
(2), (4) Date: Dec. 11, 2013

(87) PCT Pub. No.: WO2012/176113
PCT Pub. Date: Dec. 27, 2012

(65) Prior Publication Data
US 2014/0111854 A1      Apr. 24, 2014

(30) Foreign Application Priority Data
Jun. 22, 2011   (EP) .................................... 11170982

(51) Int. Cl.
| | | |
|---|---|---|
| *G02B 27/22* | (2006.01) | |
| *H04N 13/04* | (2006.01) | |
| *H01L 51/52* | (2006.01) | |

(52) U.S. Cl.
CPC ...... *G02B 27/2214* (2013.01); *H04N 13/0404* (2013.01); *H04N 13/0415* (2013.01); *H01L 51/5275* (2013.01); *H04N 13/0447* (2013.01)

(58) Field of Classification Search
CPC .............. G02B 27/2214; G02B 27/20–27/26; H04N 13/00–2013/0096; G02F 1/167
USPC ............... 359/462–477; 348/42–60; 345/107
See application file for complete search history.

(56) References Cited

U.S. PATENT DOCUMENTS

| | | |
|---|---|---|
| 5,076,687 A | 12/1991 | Adelson |
| 6,069,650 A | 5/2000 | Battersby |
| 7,084,848 B2 | 8/2006 | Senda et al. |
| 7,800,703 B2 | 9/2010 | Zuidema |

(Continued)

FOREIGN PATENT DOCUMENTS

| | | | | |
|---|---|---|---|---|
| JP | 2001-143868 | * | 5/2001 | ............. H05B 33/12 |
| JP | 2001143868 A | | 5/2001 | |

(Continued)

OTHER PUBLICATIONS

O.H. Willemsen, S.T. de Zwart and W.L. IJzerman, "Fractional viewing systems to reduce banding in lenticular based 3D displays". In Proc. Int. Disp. Workshops, vol. 12, pp. 1789-1792, 2005.

*Primary Examiner* — Scott J Sugarman
*Assistant Examiner* — Kristina DeHerrera

(57) ABSTRACT

An autostereoscopic display device has display elements, each of which has an output light intensity distribution which has at least two non-zero light intensity levels, comprising a first light intensity at the center of the display element area and a second lower light intensity at a periphery of the display element area. This means the light intensity drops more gradually at the pixel edges, so that the abrupt pixel edges are less visible despite the magnification provided by a lens arrangement of the autostereoscopic display device.

13 Claims, 5 Drawing Sheets

(56) References Cited

U.S. PATENT DOCUMENTS

| | | | |
|---|---|---|---|
| 2001/0026258 A1* | 10/2001 | Yamashita et al. | 345/89 |
| 2002/0047822 A1 | 4/2002 | Senda | |
| 2006/0221049 A1 | 10/2006 | Miyasaka | |
| 2007/0210703 A1* | 9/2007 | Izzanni | H01L 27/322 313/504 |
| 2008/0218461 A1 | 9/2008 | Sugita | |
| 2008/0218855 A1 | 9/2008 | Van Berkel | |
| 2011/0134156 A1* | 6/2011 | Yamazaki | 345/690 |
| 2011/0141560 A1* | 6/2011 | Kim et al. | 359/463 |

FOREIGN PATENT DOCUMENTS

| | | |
|---|---|---|
| WO | 2007027220 A2 | 3/2007 |
| WO | 2009057020 A1 | 5/2009 |

* cited by examiner

A.             B.             C.

AUTOSTEREOSCOPIC DISPLAY APPARATUS HAVING OPTICAL MAGNIFICATION

CROSS-REFERENCE TO PRIOR APPLICATIONS

This application is the U.S. National Phase application under 35 U.S.C. §371 of International Application No. PCT/IB2012/053072, filed on Jun. 19, 2012, which claims the benefit of European Patent Application No. 11170982.0, filed on Jun. 22, 2011. These applications are hereby incorporated by reference herein.

FIELD OF THE INVENTION

The present invention relates to display apparatus having optical magnification of the image produced by the display panel. The most common example is an autostereoscopic display apparatus having a lenticular sheet over the display panel.

BACKGROUND OF THE INVENTION

Stereoscopic displays provide an image that is made up of different sub-images at different viewing points. If suitably adjusted different sub-images (i.e. with appropriate binocular disparity) are provided to the left eye and the right eye of a viewer, the overall image is perceived by the viewer as a three dimensional image. One known method to provide differing images is by varying the colour content, with the viewer needing to wear special spectacles with a different colour-absorbing lens in each eyepiece.

Stereoscopic displays that provide an image made up of different sub-images at different viewing points without the viewer needing to wear special spectacles are known as autostereoscopic displays. A typical autostereoscopic display comprises a matrix liquid crystal display (LCD) panel comprising an array of display elements arranged in rows and columns. The display further comprises means for directing output light from the array of display elements such that the visual output provided from a given point on the display panel is dependent upon the viewing angle. This means that the right eye of a viewer will see a different view to that seen by the left eye, providing the desired stereoscopic or three-dimensional image.

One well known form of the output light directing means is a lenticular sheet overlying the display panel. A lenticular sheet, for example in the form of a moulded or machined sheet of polymer material, overlies the output side of the display panel, with its lenticular elements, comprising (semi) cylindrical lens elements, extending in the column direction with each lenticular element being associated with a respective group of two, or more, adjacent columns of display elements and extending parallel with the display element columns.

In an arrangement in which each lenticule is associated with two columns of display elements, the display panel is driven to display a composite image comprising two 2-D sub-images vertically interleaved, with alternate columns of display elements displaying the two images, and the display elements in each column providing a vertical slice of the respective 2-D sub-image. The lenticular sheet directs these two slices, and corresponding slices from the display element columns associated with the other lenticules, to the left and right eyes respectively of a viewer in front of the sheet so that, with the sub-images having appropriate binocular disparity, the viewer perceives a single stereoscopic image. In other, so-called multi-view, arrangements, in which each lenticule is associated with a group of more than two adjacent display elements in the row direction and corresponding columns of display elements in each group are arranged appropriately to provide a vertical slice from a respective 2-D (sub-) image, then as a viewer's head moves a series of successive, different, stereoscopic views are perceived for creating, for example, a greater degree of viewing freedom and/or a look-around impression.

Autostereoscopic display apparatus of this kind can be used for various applications, for example in medical imaging, virtual reality, games, mobile telephone and CAD fields.

Autostereoscopic display apparatus switchable between 2-D and autostereoscopic operation are known. This is provided, for example, by provision of a diffusion layer switchable between diffusing and non-diffusing states, such that the diffusing state cancels out the light directional effect of the lenticular lens, thus reducing the autostereoscopic view to a 2-D view.

Typically, in autostereoscopic mode (or in a display having only the 3D mode), spatial resolution is lost due to the provision of separate individually addressable display elements of a given colour for different views along the row direction in a given pixel. Also, brightness variations occur across the display, i.e. in the row direction.

The effect of the spatial resolution loss in an autostereoscopic display, as discussed above, has been alleviated by the use of slanted orientation of the lenticular lens relative to the column direction of the pixels. Such an arrangement tends to "share" the loss of resolution between row and column direction, thus reducing the starkness of the resolution in the row direction, especially for larger numbers of view multi-view displays.

However, by slanting the lenticular elements at an angle to the columns of display pixels, other problems are introduced or worsened. As a user's head is moved from left to right, variations in light intensity are observed. These intensity variations are caused by the lenticular elements imaging varying amounts of the opaque black mask that defines the pixel areas of the display panel. The variations are observed by the user as moiré interference.

The problem of light intensity variations may be addressed by altering the focal axes of the lenticular elements, so that broader bands of the display panel are imaged. However, cross talk between the different views is then introduced, which is also undesirable.

U.S. Pat. No. 7,800,703 discloses an arrangement in which display areas of the display pixels have edges that are substantially parallel to the lenticular element axes. By providing a device having pixel display areas with edges that are parallel to the lenticular element axes, the problems of light intensity variations and cross talk between views are reduced or eliminated. The lenticular element axes, however, remain slanted at an angle to the display pixel columns, and so it is still possible to "consume" both vertical and horizontal resolution to increase the number views displayed by the device.

The problem of the pixel sub-structure (such as the black matrix) being visible to the viewer is a potential problem in any display apparatus having optical magnification of the display panel output. Another example of autostereoscopic display having an optical lens arrangement at the pixel output is a free focus autostereoscopic display design recently proposed by the applicant (but as yet unpublished)

In this free focus arrangement, the display system has a display device having an array of pixels and an optical system which includes a microlens array over the display device, wherein each pixel is associated with a microlens. The optical system images sub-arrays of pixels onto one pupil of a viewer, with different pixels of the sub-array imaged to different areas of the pupil. In this manner, the display intentionally images a plurality of images (one image comprising the combination of the corresponding pixels from all sub-arrays) to a single pupil.

This approach provides additional information to each pupil, in particular multiple views are provided to each pupil at the same time, and which are provided to different locations within the pupil. This provides depth information that can be interpreted by the brain. For example, even if the display is provided to one pupil only (or the same information is provided to both pupils), the brain is able to perceive a more real image because the small image differences (at the scale of the different viewing locations across the area of the pupil) encode depth information.

The optical system is preferably driven based on a pupil tracking system, wherein the light output of the combination of pixels imaged to a given area of the pupil by the array of microlenses together define an image of a scene. This provides an optical beam steering solution. This means light can be provided only to the pupil (or pupils) so creating an efficient system. However, the pupil tracking may not be required for a single-user goggle based display system. In this case, a smaller number of views can fill the field of view. The display is positioned over the eyes in a relatively constant relative position, and slight relative movement will not hinder the operation in that other views are present for the viewer. By providing different views to the two pupils, an autostereoscopic display is formed.

A trade off can be made between spatial and temporal resolution. This is especially important in applications such as TV where the number of viewers is not known beforehand. The system can serve each of the viewers (or even pupils) one by one, or serve all users a lower-resolution image, or a trade-off between the two can be made.

In this type of optical beam steering system there can be one emitter and lens system per sub-pixel, or a pixellated emitter system and lens system per pixel. With suitable parameters, the optical magnification of a beam steering display is in a typical range of 200 to 500 which is significantly larger than for a lenticular display. More specifically, the shape of the pixels will influence the bokeh (a measure of the aesthetic quality of the out of focus blur part of an image) that the viewer will observe in the out-of-focus content displayed on the screen. Thus, the pixel shape is part of the (perceptual) quality of the display.

This (unpublished) approach will not be described further. However, it will be appreciated that the problem of optical magnification of the sub-pixel structure is not limited to lenticular autostereoscopic displays, and the solutions provided by the invention are applicable to many different display designs, including the approach briefly outlined above.

Various prior art references disclose autostereoscopic display devices in which the individually addressable display elements are shaped other than rectangular. For example EP 1 929 796 discloses an arrangement in which the shape of the sub-pixels (or pixels) comprises the shape remaining from a rectangular footprint when one or more cut-outs is removed; the one or more cut-outs being positioned relative to the slanted angle of the light directing elements such that the extent by which each respective light collection line overlaps the individually addressable display elements is made more uniform.

For most display applications such as HDTV and cell phones, the pixels are small enough for the sub-pixel structure to be practically "invisible". However if displays are combined with magnifying optical means, such as the lenticular foil in autostereoscopic displays or the free focus system outlined briefly above, the sub-pixel structure is magnified, and thus made visible to the viewer. The shaping of pixels to reduce banding, for example as outlined in EP 1 929 796 does not solve this problem.

In order to increase the efficiency and/or the lifetime of the display, all traditional displays always try to maximize the light emission per pixel by ensuring that the emission intensity across the display is at a uniform level, and ensuring that the emission area of the display is maximised (the aperture).

As a result, sub-pixels tend to have emission areas with uniform intensity, creating extremely abrupt boundaries between areas of maximum emission intensity and zero emission intensity (e.g. the black mask), combined with many right angled (90 degree) corners. For this reason, the phenomenon is clearly visible in autostereoscopic displays not only as banding but also as visibly delineated sub-pixels.

SUMMARY OF THE INVENTION

According to the invention, there is provided an autostereoscopic display apparatus, comprising:

a plurality of individually addressable display elements arranged in an array of rows and columns, wherein each display element comprises the smallest area which is for displaying a single pixel of image data of a single colour; and a lens arrangement for directing different views displayed simultaneously by the display elements to different spatial locations, wherein each display element has an output light intensity distribution which has at least two non-zero light intensity levels, comprising a first light intensity at the centre of the display element area and a second lower light intensity at a periphery of the display element area.

The effect of the invention is to provide a sub-pixel structure arranged such that the emission intensity distribution appears smooth when projected by the lens arrangement, even when it implements a significant magnification. This output light intensity distribution can be achieved by intentionally varying the light emission intensity across the individual display element. This approach is totally contrary to the accepted wisdom of pixel layout in a traditional direct view display.

Each display element can comprise an electroluminescent material having a uniform light output intensity across the display element area and an optical component (such as a filter) for adjusting the output light intensity distribution. This enables a standard pixel layout to be used.

In another example, each display element comprises at least two electroluminescent material areas, each associated with a respective drive transistor. This provides at least two sub-pixel areas (per display element, which itself is a sub-pixel or pixel).

In this case, each display element can be associated with a single addressing electrode and a drive electrode for each electroluminescent material area. Alternatively, each display element can be associated with a single drive electrode and an addressing electrode for each electroluminescent material area. These approaches enable the two display element areas to be addressed independently, either at the same time or sequentially.

However, each display element can be associated with a single drive electrode and a single addressing electrode, and wherein the drive transistor associated with each electroluminescent material area has different current output characteristics. The same drive signals are then used to drive the two areas, but the different drive transistor characteristics result in different output intensity.

Alternatively, again with each display element associated with a single drive electrode and a single addressing electrode, the drive transistors associated with the electroluminescent material areas can have the same current output characteristics, but the surface areas of the electroluminescent material areas are different. These different areas give rise to different current density.

Each display element can comprise a central electroluminescent material area and an outer concentric electroluminescent material area around the central area.

The lens arrangement can comprise a lenticular lens array, wherein the lenses have a long axis which is slanted at an acute angle to the direction of the columns of the display element array. The invention can enable the problem of banding to be addressed in such a display, as well as the problem of visible transitions between sub-pixels. For example, a filter arrangement can be provided for varying the display element output intensity to reduce banding.

The invention also provides a method of operating an autostereoscopic display apparatus, wherein the apparatus comprises a plurality of individually addressable display elements arranged in an array of rows and columns wherein each display element comprises the smallest area which is for displaying a single pixel of image data of a single colour, wherein the method comprises:

directing different views displayed simultaneously by the display elements to different spatial locations using a lens arrangement; and controlling the output light intensity distribution for each display element to have a first light intensity at the centre of the display element area and a second lower light intensity at a periphery of the display element area.

BRIEF DESCRIPTION OF THE DRAWINGS

Embodiments of the present invention will now be described, by way of example, with reference to the accompanying drawings, in which.

DETAILED DESCRIPTION OF THE EMBODIMENTS

The invention provides an autostereoscopic display device in which each display element has an output light intensity distribution which has at least two non-zero light intensity levels, comprising a first light intensity at the centre of the display element area and a second lower light intensity at a periphery of the display element area. This means the light intensity drops more gradually at the pixel edges, so that the abrupt pixel edges are less visible despite the magnification provided by the lens arrangement of the display device.

Figure 1:
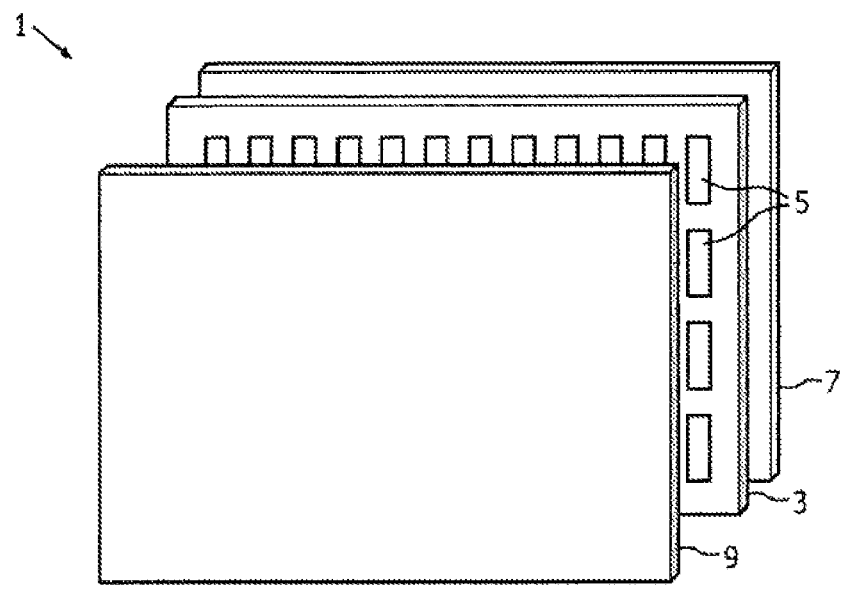
FIG. 1 is a schematic perspective view of a known direct view autostereoscopic display device

FIG. 1 is a schematic perspective view of a known direct view autostereoscopic display device 1. The known device 1 comprises a liquid crystal display panel 3 of the active matrix type that acts as a spatial light modulator to produce the display.

The display panel 3 has an orthogonal array of display pixels 5 arranged in rows and columns. For the sake of clarity, only a small number of display pixels 5 are shown in the Figure. In practice, the display panel 3 might comprise about one thousand rows and several thousand columns of display pixels 5.

The structure of the liquid crystal display panel 3 is entirely conventional. In particular, the panel 3 comprises a pair of spaced transparent glass substrates, between which an aligned twisted nematic or other liquid crystal material is provided. The substrates carry patterns of transparent indium tin oxide (ITO) electrodes on their facing surfaces. Polarising layers are also provided on the outer surfaces of the substrates.

Each display pixel 5 comprises opposing electrodes on the substrates, with the intervening liquid crystal material therebetween. The shape and layout of the display pixels 5 are determined by the shape and layout of the electrodes. The display pixels 5 are regularly spaced from one another by gaps.

Each display pixel 5 is associated with a switching element, such as a thin film transistor (TFT) or thin film diode (TFD). The display pixels are operated to produce the display by providing addressing signals to the switching elements, and suitable addressing schemes will be known to those skilled in the art.

The gaps between the display pixels 5 are covered by an opaque black mask. The mask is provided in the form of a grid of light absorbing material. The mask covers the switching elements and defines the individual display pixel areas.

The display panel 3 is illuminated by a light source 7 comprising, in this case, a planar backlight extending over the area of the display pixel array. Light from the light source 7 is directed through the display panel 3, with the individual display pixels 5 being driven to modulate the light and produce the display.

The display device 1 also comprises a lenticular sheet 9 arranged over the display side of the display panel 3. The lenticular sheet 9 comprises a row of lenticular elements extending parallel to one another.

Figure 2:
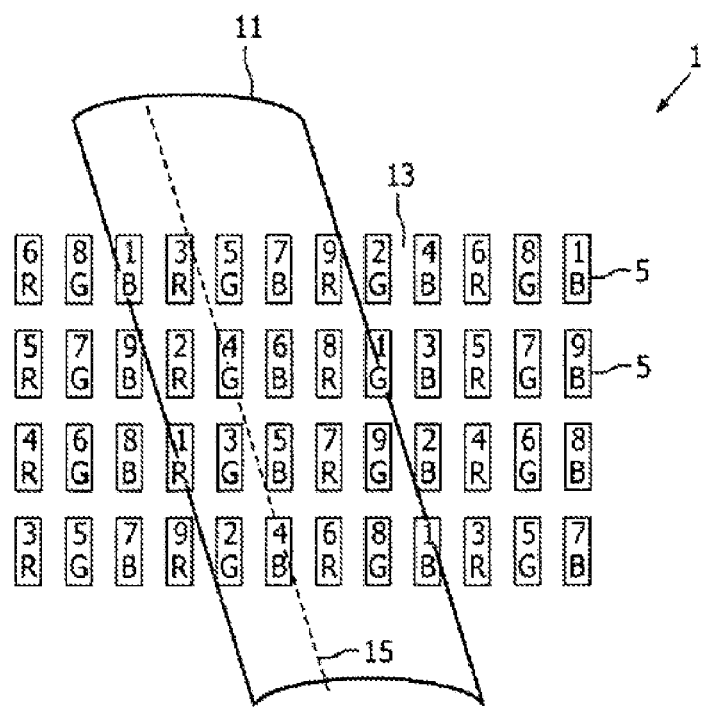
FIG. 2 shows more clearly the arrangement of the display pixels and lenticular elements in the display device of FIG. 1.

The arrangement of the display pixels 5 and lenticular elements 11 are shown more clearly in FIG. 2, which is a schematic plan view of the display device 1 shown in FIG. 1. Again, only a small number of the display pixels 5 are shown for the sake of clarity.

As can be seen from FIG. 2, the lenticular elements 11, of which only one is shown, are slanted at an angle to the column direction of the display pixels 5, i.e. their longitudinal axis defines an acute angle with the column direction of the display pixels 5.

The lenticular elements 11 are in the form of convex cylindrical lenses, and they act as an optical director means to provide different images, or views, from the display panel 3 to the eyes of a user positioned in front of the display device 1. The lenticular elements 11 also provide a number of different images, or views, to the eyes of the user as the user's head moves from left to right in front of the display device 1.

The autostereoscopic display device 1 shown in FIGS. 1 and 2 is capable of providing nine different views. In particular, for each group of eighteen display pixels 5 overlaid by a lenticular element 11, the lenticular element 11 projects two pixels 5 in each of nine different directions, so as to form the nine different views. The display pixels 5 in FIG. 2 are labelled from "1" to "9" to indicate to which of the views they correspond.

As well as the display pixels 5, the lenticular element 11 also projects portions of the black mask 13 provided between the display pixels 5.

For example, the lenticular element 11 shown in FIG. 2 overlies a group of eighteen display pixels 5. The dashed line 15 indicates a portion of the display panel 3 that is projected by the lenticular element 11 in one particular direction to produce one of the nine different views. As can be seen, two display pixels for view "4" are projected, as is a significant amount of the black mask 13. Small amounts of display pixels for the neighbouring views "3" and "5" are also projected, and this is observed as cross talk between the views.

It will be appreciated that, as the user's head moves from left to right, his/her eyes will receive several different ones of the nine views, in turn. As the user's head moves in this way, the proportion of the black mask 13 received by the user's eyes also varies, thereby causing light intensity variations. These undesirable light intensity variations are observed as a moiré pattern (banding) but also the fact that the intensity of the image may change rapidly as the viewer moves to the edge of the projected region can be disturbing. In some cases the viewer will see the projected shape of the pixel.

The invention aims to make the pixel structure less disturbing to the viewer by intentionally varying the intensity of the emission across the pixel. There are several approaches to this, for example by adding an optical element with varying transmission across each pixel or, for an emissive display such as an OLED display, by ensuring that the emission intensity of sub-emitters within a sub-pixel in the display are different.

In the case of an OLED display, a fixed amount of space in the display area is used within each sub-pixel for putting in the electronics. Within each pixel, red green and blue emitting parts are known to have different area and shape for example to correct for differential ageing of the red green and blue pixels. The differentiation of area allows lower current density for the faster ageing colour. Thus, the emitting area of the blue sub-pixel can be larger than that of the green sub-pixel. Also, the intensity of the pixels may be adjusted such that they are different between sub-pixels in order to adjust for the ageing effect. The sub-pixels nevertheless have a uniform intensity and sharp edges.

Figure 3:
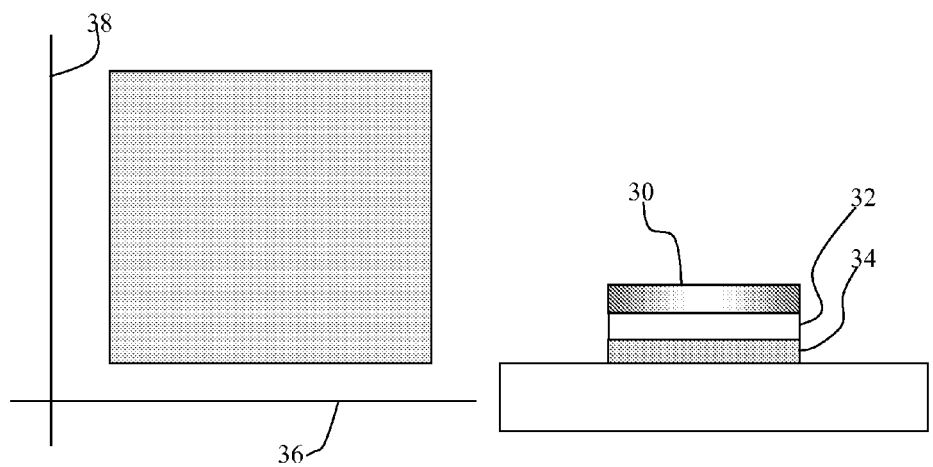
FIG. 3 shows a first example of pixel structure of the invention.

FIG. 3 shows a first embodiment of the invention in which an additional optical component 30 such as a filter is situated above a uniform intensity emitting layer 32 such as an OLED (organic light emitting diode) or PLED (polymer light emitting diode) layer. The light emitting layer is driven by an emitter electrode 34. The pixel is shown schematically with a rectangular shape in plan view at the intersection of a row conductor 36 and column conductor 38.

The additional optical component varies the light intensity distribution across the pixel area. This approach can be used in combination with a conventional display pixel layout, for example where the pixels tend to have rectangular shaped emission areas such as shown in FIG. 3 with uniform intensity, creating extremely abrupt boundaries between areas of maximum emission intensity and zero emission intensity.

Emissive (OLED or PLED) or backlit LCD displays may use this approach.

The optical element 30 can have an absorption which increases towards the edges of the pixel, whereby the light intensity decreases towards the edges. An example light intensity may be for example a Gaussian light distribution decreasing from the centre of the pixel. Other optimizations may however reduce banding more effectively as described below.

A disadvantage of this approach is that the additional optical element adds extra manufacturing steps to the display process, hence increasing the price of the display. In addition, as the component is partially absorbing light, the power efficiency of the display is reduced.

For these reasons, a preferred embodiment of the invention, using an emissive display, is described with reference to FIG. 4.

Figure 4:
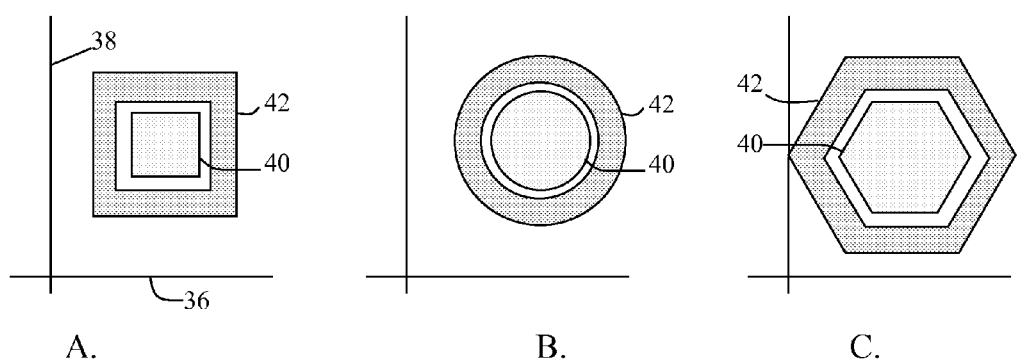
FIG. 4 shows three examples of pixel layout of the invention.

FIG. 4 shows three possible designs of pixel using light emitters, in which each "display element" comprises a set of sub-pixel elements with different emission intensity. These sub-pixel elements are all the same colour and together define a single display element of that colour. Thus, the smallest display element of a conventional display (for example a single colour sub-pixel) is divided further. In the case of a multi-colour display, each "display element" is a colour sub-pixel, and in the case of a single colour display, each "display element" can be a pixel.

Thus, the display is modified by introducing more than one emission area per pixel/sub-pixel, whereby the emission intensity (in Cd/m2) of the emission areas is different.

FIG. 4A shows a square pixel/sub-pixel, with a square inner pixel area 40 defined by a first sub-emitter, and a concentric square annulus shaped outer pixel area 42 defined by a second sub-emitter around the inner pixel area. FIG. 4B shows a round pixel/sub-pixel, with a round inner pixel area 40, and a concentric round annulus shaped outer pixel area 42 around the inner pixel area. FIG. 4C shows a hexagonal pixel/sub-pixel, with a hexagonal inner pixel area 40, and a concentric hexagonal annulus shaped outer pixel area 42 around the inner pixel area.

FIG. 4 shows a single pixel/sub-pixel at the intersection of a column (data) line 38 and row (select) line 36.

By providing the outer pixel area with a lower intensity than the inner pixel area, the light intensity decreases towards the edges of the pixel. An example light intensity may be for example a light distribution decreasing in a step-wise manner from the centre of the pixel.

There are several approaches to create such an intensity variation, but they all require that a different current density is created in the individual sub-emitters of the pixel.

In a most flexible approach, a separate addressing of the individual sub-emitters is realised by providing each sub-emitter with an individually addressable drive transistor (the drive transistor is in the form of a current source).

Figure 5:
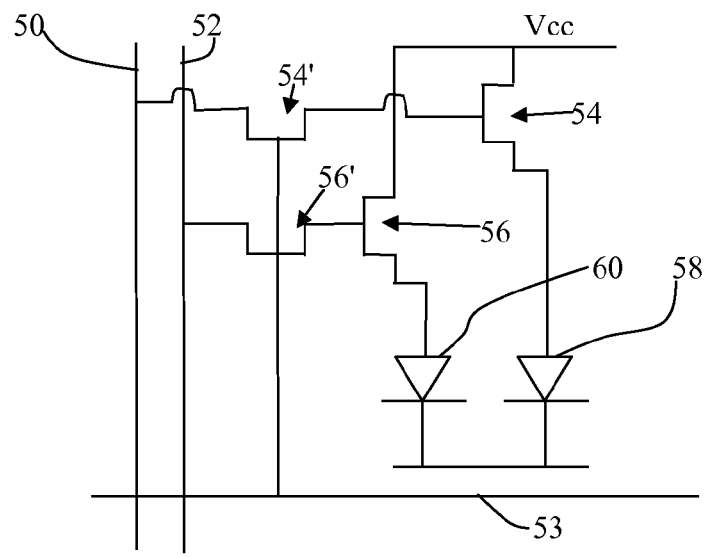
FIG. 5 shows a first addressing layout for the multiple pixel layouts of FIG. 4.

This is illustrated in FIG. 5.

Addressing of the sub-emitters is carried out either sequentially (using 2 or more separate addressing lines and a shared data line) or simultaneously (using 2 or more separate data lines and a shared addressing line). FIG. 5 shows the latter option of two data lines 50,52 which connect to respective pixel transistors 54,56 through addressing transistors 54',56' which drive the respective pixel sub-emitters 58,60 (i.e. the different pixel areas). The addressing transistors are controlled by a single row addressing line 53. A combination of these approaches may be used.

In this way, the individual sub-emitters 58,60 may have any desired emission intensity, and the light profile of the display may be tuned according to requirements.

In a less flexible embodiment, the individual sub-emitters 58,60 have a fixed intensity ratio, whereby only a single light emission profile can be realised. This has the advantage that a single row conductor and a single column conductor can be used, therefore reducing the display cost.

There are several methods to realise this approach, two of which are explained with reference to FIG. 6.

The two drive transistors 54,56 are addressed by single addressing transistor 62.

In a first example, the drive transistors 54,56 have different widths (W), lengths (L) or threshold voltages (Vth)—as current scales with these transistor characteristics according to $I \sim (W/L) \times (V-Vth)^2$. In practice, it is most suitable to scale the width of the transistor, as this can be achieved by a simple design choice. For sub-emitters with equivalent area, the intensity of the emission will scale with the width of the drive transistors.

In a second example, the drive transistors 54,56 are identical, and the drive current from both transistors is identical (they have same W/L ratio)—but the sub-emitters have different areas. In this case, the intensity of the emission will scale inversely with the area of the sub emitters, so to create the desired drop in intensity towards the edges of the pixel, the sub-emitters become larger away from the centre of the pixel.

A combination of the above approaches can be made.

The advantage of these approaches is that no extra manufacturing steps are added to the display process and the power efficiency of the display will be maintained (and may indeed by significantly increased compared to a display which projects images in all directions as the emitting areas may be significantly smaller).

Ideally, the invention is implemented by a process that allows the creation of emissive structures separated by a spacing smaller than that of visible light, as in this case the individual sub-emitters can be positioned so close to each other that there are no visible boundaries between sub-emitters.

This will radically improve the perceived smoothness of the light emission across the pixel. An example of such a process is the photolithograph process that is used to create LCD and AMOLED display panels. In such a process, structures of 200-300 nm can be created, which can be used as the spacing between adjacent sub-emitters.

Ideally, all sub-emitters will be realised in a single mask layer, as this enables the use of such a high resolution across a very large substrate (2 m×2 m) without the requirement to align structure between mask layers with high accuracy.

Figure 6:
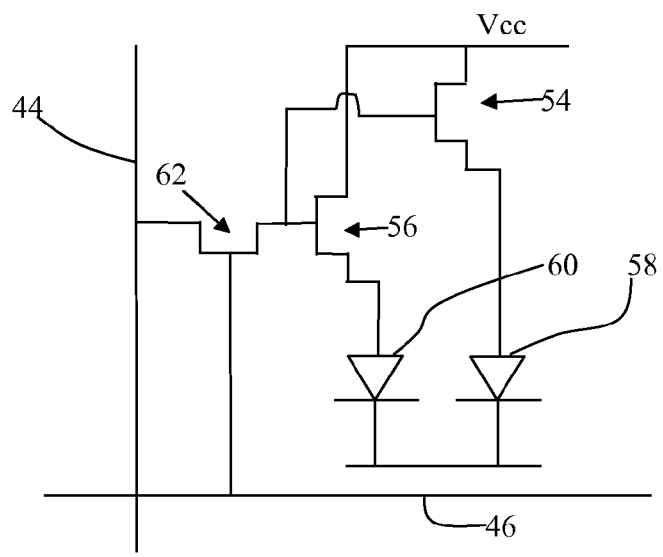
FIG. 6 shows a second addressing layout for the multiple pixel layouts of FIG. 4.

The examples of FIGS. 4 to 6 refer to emissive (AMO-LED) displays. However, the same approach of multiple sub-pixels per "display element" can also be applied to non-emissive, backlit displays—such as LCDs, electrophoretic and electrowetting displays—where the brightnesses of the pixels are derived from the voltages applied to the pixel electrodes (as opposed to the current for emissive displays).

In these cases, it will be necessary to have either individual addressing transistors for the separate pixel electrodes, or alternatively means to split the voltage signal across the different pixel electrodes for example using a capacitive splitting concept—such as the so-called kick-back phenomenon, which depends upon the capacitance of the pixels compared to that of a storage capacitor, and whereby the electrode capacitance scales with the size of the electrodes.

As mentioned above with reference to EP 1 929 796, designing the shape of the pixels has been considered as a way to reduce the banding problem. In addition, a filtering function (such as implemented by the optical component 30 in FIG. 3) can include a pattern designed to reduce banding, in addition to reducing the intensity towards the edges of the pixel.

These approaches, of introducing an output intensity which has a function dependent on the lenticular design, can be combined with the approach of the invention.

Figure 7:
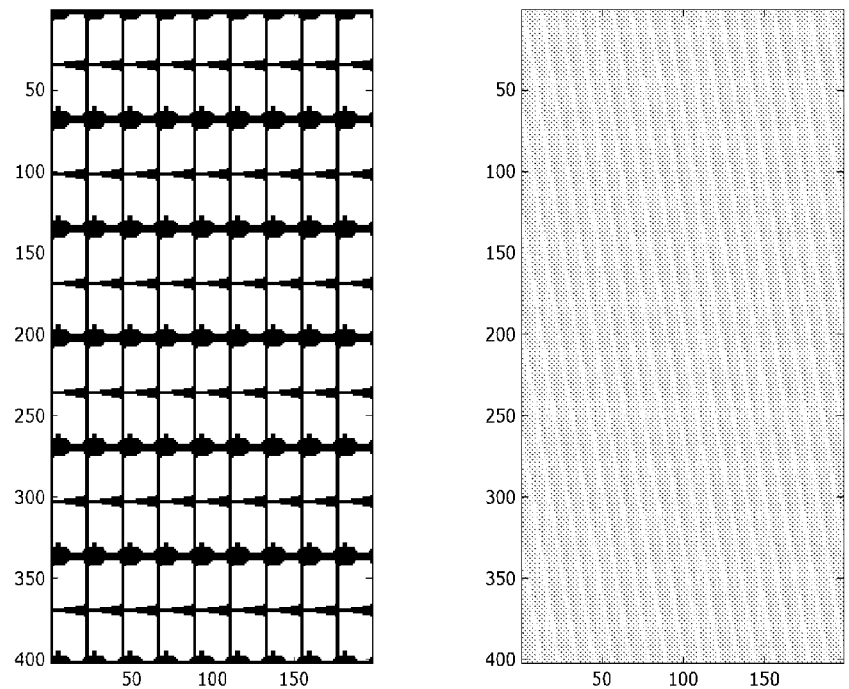
FIG. 7 shows the banding problem which can arise in lenticular autostereoscopic displays.

FIG. 7 shows the black mask shape of a real pixel structure and shows the banding pattern that results when used in a lenticular autostereoscopic display. The banding pattern is dependent on the lenticular lens pitch and slant.

A variable transmission across the pixel areas can reduce or avoid this banding. Along a line in the direction of the lenticular lenses, no optical magnification takes place and thus any pixel structures that would not be visible with the naked eye without the lenticular sheet, remain invisible after adding the sheet. However on the line perpendicular to the lens direction, there is magnification making the sub-pixel structures visible.

Figure 8:
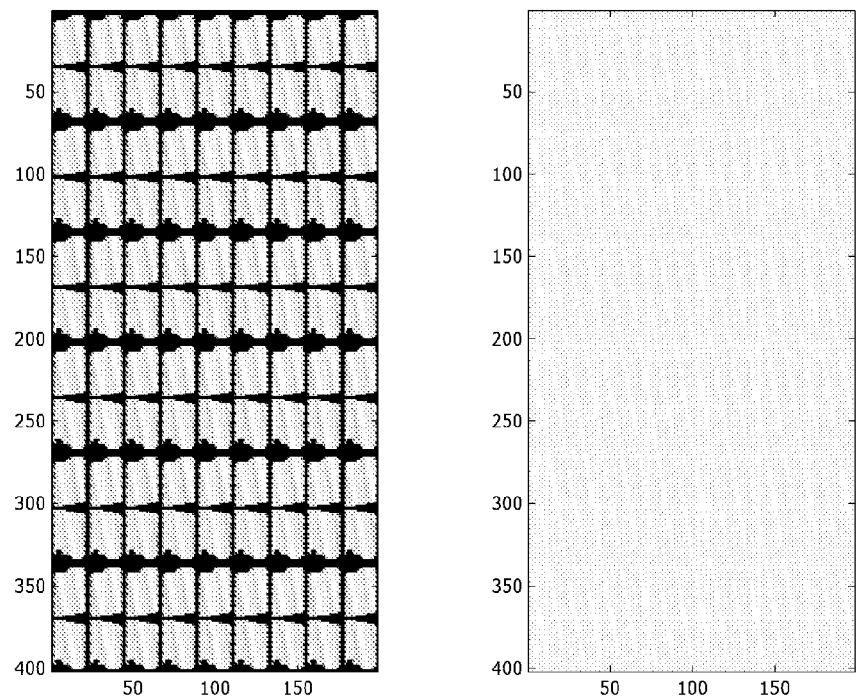
FIG. 8 shows a first way to address the banding problem which can employed in conjunction with the invention.

FIG. 8 shows the pixel structure with a filter applied. The filter profile varies only perpendicular to the lens axis. The reduction in banding can be seen.

Figure 9:
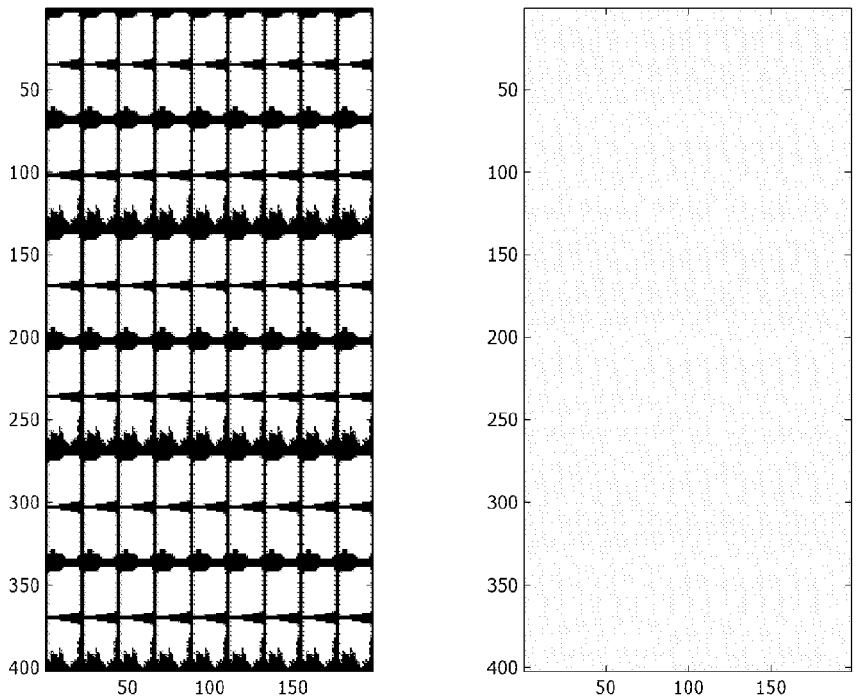
FIG. 9 shows a second way to address the banding problem which can employed in conjunction with the invention.

FIG. 9 shows the pixel structure with a modified pixel shape, for example as explained in EP 1 929 796. The reduction in banding can again be seen.

Figure 10:
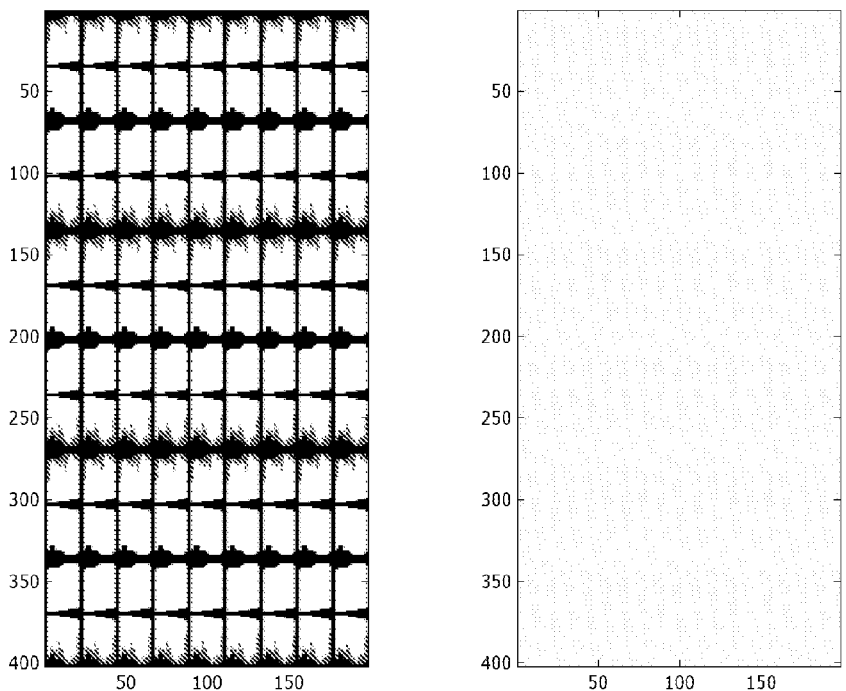
FIG. 10 shows a third way to address the banding problem which can employed in conjunction with the invention.

FIG. 10 shows the pixel structure with two levels of intensity (the grey areas represent an intermediate intensity lower than the white areas), but designed to reduce banding rather than to provide lower intensity edges. The reduction in banding can again be seen.

The invention can be applied to any autostereoscopic display technology which uses optical lenses (thereby providing magnification) to direct different views to different spatial locations, including optical beam steering/head tracking approaches as well as static lenticular screens, and it applies to all display technologies including emissive and backlight modulating types.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An autostereoscopic display apparatus, comprising:
a plurality of individually addressable display elements arranged in an array of rows and columns, wherein each display element comprises the smallest area displaying a single pixel of image data of a single color; and
a lens arrangement for directing different views displayed simultaneously by the display elements to different spatial locations,
wherein each display element has an output light intensity distribution and a display element area, the display element area having at least a center and a periphery,
wherein the light intensity distribution has at least two non-zero light intensity levels, the at least two non-zero light intensity level comprising a first light intensity at the center of the display element area and a second lower light intensity at a periphery of the display element area.

2. An apparatus as claimed in claim 1, wherein each display element comprises an electroluminescent material having a uniform light output intensity across the display element area and an optical filter above the electroluminescent material,
wherein the optical filter is arranged to adjust the output light intensity distribution.

3. An apparatus as claimed in claim 1,
wherein each display element comprises at least two electroluminescent material areas,
wherein each electroluminescent material area is associated with a drive transistor.

4. An apparatus as claimed in claim 3, further comprising a drive electrode for each electroluminescent material area, wherein each display element is associated with a single addressing electrode.

5. An apparatus as claimed in claim 3, further comprising an addressing electrode for each electroluminescent material area, wherein each display element is associated with a single drive electrode.

6. An apparatus as claimed in claim 3, wherein each display element is associated with a single drive electrode and a single addressing electrode, wherein the drive transistor associated with each electroluminescent material area has different current output characteristics.

7. An apparatus as claimed in claim 3,
wherein each display element is associated with a single drive electrode and a single addressing electrode,
wherein the drive transistors associated with the electroluminescent material areas have the same current output characteristics,
wherein the surface areas of the electroluminescent material areas are different.

8. An apparatus as claimed in claim 3, wherein each display element comprises a central electroluminescent material area and an outer concentric electroluminescent material area around the central area.

9. An apparatus as claimed in claim 8, further comprising a filter having an absorption that increases towards periphery of the display element area and varying the display element output intensity.

10. An apparatus as claimed in claim 1, wherein the lens arrangement comprises a lenticular lens array,
wherein the lenses have a long axis,
wherein the long axis is slanted at an acute angle to the direction of the columns of the array.

11. An apparatus as claimed in claim 1, wherein the smallest area which is for displaying a single pixel of image data of a single color is one Red sub-pixel, one Green sub-pixel or one Blue sub-pixel of one pixel.

12. A method of operating an autostereoscopic display apparatus, wherein the apparatus comprises a plurality of individually addressable display elements arranged in an array of rows and columns wherein each display element comprises the smallest area which is for displaying a single pixel of image data of a single color, wherein the method comprises:
directing different views displayed simultaneously by the display elements to different spatial locations using a lens arrangement; and
controlling the output light intensity distribution for each display element to have a first light intensity at the color of the display element area and a second lower light intensity at a periphery of the display element area.

13. An autostereoscopic display apparatus, comprising:
a plurality of individually addressable display elements of a pixel arranged in an array of rows and columns; and
a lens arrangement for directing different views displayed simultaneously by the display elements to different spatial locations;
wherein each display element include a set of at least one sub-pixel elements of one color and has an output light intensity distribution,
wherein the sub-pixel provides a first non-zero light intensity at the center of the display element area and a second lower non-zero light intensity at a periphery of the display element area,
wherein respective display elements of a set of at least one of sub-pixel elements of one color have different light intensities.

* * * * *